(12) United States Patent
Nentwig

(10) Patent No.: US 9,112,596 B2
(45) Date of Patent: Aug. 18, 2015

(54) TRANSMITTER

(71) Applicant: Broadcom Corporation, Irvine, CA (US)

(72) Inventor: Markus Rudiger Nentwig, Helsinki (FI)

(73) Assignee: BROADCOM CORPORATION, Irvine, CA (US)

( * ) Notice: Subject to any disclaimer, the term of this patent is extended or adjusted under 35 U.S.C. 154(b) by 0 days.

(21) Appl. No.: 14/155,663

(22) Filed: Jan. 15, 2014

(65) Prior Publication Data

US 2014/0198879 A1 Jul. 17, 2014

(51) Int. Cl.
*H04B 17/00* (2006.01)
*H03F 1/32* (2006.01)

(52) U.S. Cl.
CPC .......... *H04B 17/001* (2013.01); *H03F 1/3241* (2013.01)

(58) Field of Classification Search
USPC .................................. 375/297, 300
See application file for complete search history.

(56) References Cited

U.S. PATENT DOCUMENTS

| 7,440,733 | B2 | 10/2008 | Maslennikov et al. |
| 2007/0190952 | A1* | 8/2007 | Waheed et al. ............ 455/114.3 |
| 2012/0264380 | A1 | 10/2012 | Cobley |
| 2012/0269240 | A1 | 10/2012 | Balteanu et al. |

OTHER PUBLICATIONS

Gerard Wimpenny; Understand and Characterize Envelope-Tracking Power Amplifiers, Nujira Ltd—May 10, 2012, Article originally appeared on EDN's sister site, RF and Microwave Designline, (9 pages).
Robert Gade, Electronic Specifier Design; Dec. 2011; vol. 1;Issue 10; Publisher Steve Reginier; Kent TN9 2AA, UK; www.electronicspecifier.com; (pp. 36-39).

* cited by examiner

*Primary Examiner* — Kabir A Timory
(74) *Attorney, Agent, or Firm* — Oblon, McClelland, Maier & Neustadt, L.L.P.

(57) ABSTRACT

Embodiments provide methods, apparatus and computer software for use in calibrating a transmitter in operative association with a variable supply voltage. A phase distortion of the power amplifier is determined for a given instantaneous power. On the basis of the determined phase distortion for the power amplifier at the given instantaneous power, the transmitter is calibrated. Examples of transmitters in respect of which embodiments may be practiced include envelope tracking transmitters, envelope elimination and restoration transmitters, and polar transmitters.

20 Claims, 3 Drawing Sheets

TRANSMITTER

TECHNICAL FIELD

The present invention relates to calibration of transmitters, and in particular, to the calibration of any transmitter arrangement where the supply voltage of an amplification stage is varied, such as is the case for envelope tracking transmitters, polar transmitters or envelope-elimination-and-restoration transmitters, for example.

BACKGROUND

Transmitter circuits are often used in wireless communication devices to transmit data signals via a suitable antenna in the form of electromagnetic radiation. "Wireless communication devices" include in general any device capable of connecting wirelessly to a network, and in particular mobile devices including mobile or cell phones (including so-called "smart phones"), personal digital assistants, pagers, tablet and laptop computers, content-consumption or generation devices (for music and/or video for example), data cards, USB dongles, etc., as well as fixed or more static devices, such as personal computers, game consoles and other generally static entertainment devices, various other domestic and non-domestic machines and devices, etc.

In order to emit a signal with a suitable power and range, a power amplifier is often used to amplify the signal prior to transmission. Power amplifiers typically operate more efficiently when near the limit of their operating range. This observation has led to the development of transmitters that dynamically adjust the supply voltage of a power amplifier in dependence on properties of the signal being transmitted. One such type of transmitter arrangement, commonly referred to in the art as an envelope tracking transmitter, dynamically adjusts the supply voltage of a power amplifier in dependence on the magnitude (or "envelope") of the signal being amplified.

FIG. 1 shows schematically an example of an envelope tracking transmitter arrangement 100 as known in the art. Data signal 102 is supplied to modulation circuit 104 which performs the necessary operations to modulate the data signal onto a higher frequency carrier signal. The modulated signal is then supplied to power amplifier 106 in order to amplify the strength of the signal prior to transmission via antenna 108. In order to improve the efficiency of the transmitter 100, an envelope detector 110 is used to determine the magnitude of data signal 102. The determined magnitude is then referenced against previously stored data in the form of shaping table 112, detailing a predetermined mapping between the magnitude of the signal and an efficient supply voltage for power amplifier 106. Hence, the supply voltage of power amplifier 106 is dynamically altered during operation to improve the operating efficiency of transmitter 100.

However, properties of the transmitter components (including the gain of the power amplifier) may change over time due to e.g. component ageing, temperature effects etc. and the mapping stored in the shaping table may no longer reflect a suitably efficient relationship. A possible method for ongoing calibration of an envelope tracking transmitter is to monitor the gain of the power amplifier to detect any deviations for the expected gain. However, detection of small changes in gain is difficult during normal operation of a transmitter for several reasons. For example, a transmitter typically comprises multiple amplifier stages, and the propagation of gain tolerances through each of these stages makes the total gain of all stages hard to establish to a sufficient degree of accuracy.

Hence, it would be desirable to provide improved measures for calibrating a transmitter arrangement where the supply voltage of an amplification stage is varied, in particular for ongoing calibration during normal operation of the device.

SUMMARY

In accordance with a first exemplary embodiment of the present invention, there is provided a method for calibrating a transmitter comprising a power amplifier in operative association with a variable supply voltage, the method comprising:

determining a phase distortion of the power amplifier at a given instantaneous power; and calibrating the transmitter on the basis of the determined phase distortion.

In accordance with a second exemplary embodiment of the present invention, there is provided apparatus for calibrating a transmitter comprising a power amplifier in operative association with a variable supply voltage, the apparatus comprising:

At least one phase comparison unit, configured to determine a phase distortion of the power amplifier at a given instantaneous power; and At least one calibration unit, configured to calibrate the transmitter on the basis of the determined phase distortion.

In accordance with a third exemplary embodiment of the present invention, there is provided computer software for use in calibrating a transmitter, the envelope tracking transmitter comprising a power amplifier in operative association with a variable supply voltage, the computer software being adapted to:

determine the phase distortion of the power amplifier at a given instantaneous power; and calibrate the transmitter on the basis of the determined phase distortion.

In accordance with further embodiments, there is provided apparatus for calibrating a transmitter comprising a power amplifier in operative association with a variable supply voltage, the apparatus comprising:

means for determining a phase distortion of the power amplifier at a given instantaneous power; and means for calibrating the transmitter on the basis of the determined phase distortion.

In accordance with yet further embodiments, there is provided apparatus comprising:

at least one processor;

and at least one memory including computer program instructions;

the at least one memory and the computer program instructions being configured to, with the at least one processor, cause the apparatus at least to perform a method for calibrating an transmitter comprising a power amplifier in operative association with a variable supply voltage, the method comprising:

determining a phase distortion of the power amplifier at a given instantaneous power; and calibrating the transmitter on the basis of the determined phase distortion.

Examples of transmitters in respect of which embodiments may be practised include envelope tracking transmitters, envelope elimination and restoration transmitters, and polar transmitters.

Further features and advantages of the invention will become apparent from the following description of preferred embodiments of the invention, given by way of example only, which is made with reference to the accompanying drawings.

DETAILED DESCRIPTION

Embodiments have arisen from a realisation by the inventors that, in addition to affecting the gain of a power amplifier in the manner described above, the supply voltage also influences the phase distortion of the power amplifier. More specifically, as the relationship between the supply voltage and phase distortion of a power amplifier is a deterministic characteristic of the given power amplifier, the inventors have realised that by determining the phase distortion of the power amplifier, it is possible to determine whether the power amplifier is operating with the intended gain, and the transmitter can be calibrated on this basis.

Figure 1:
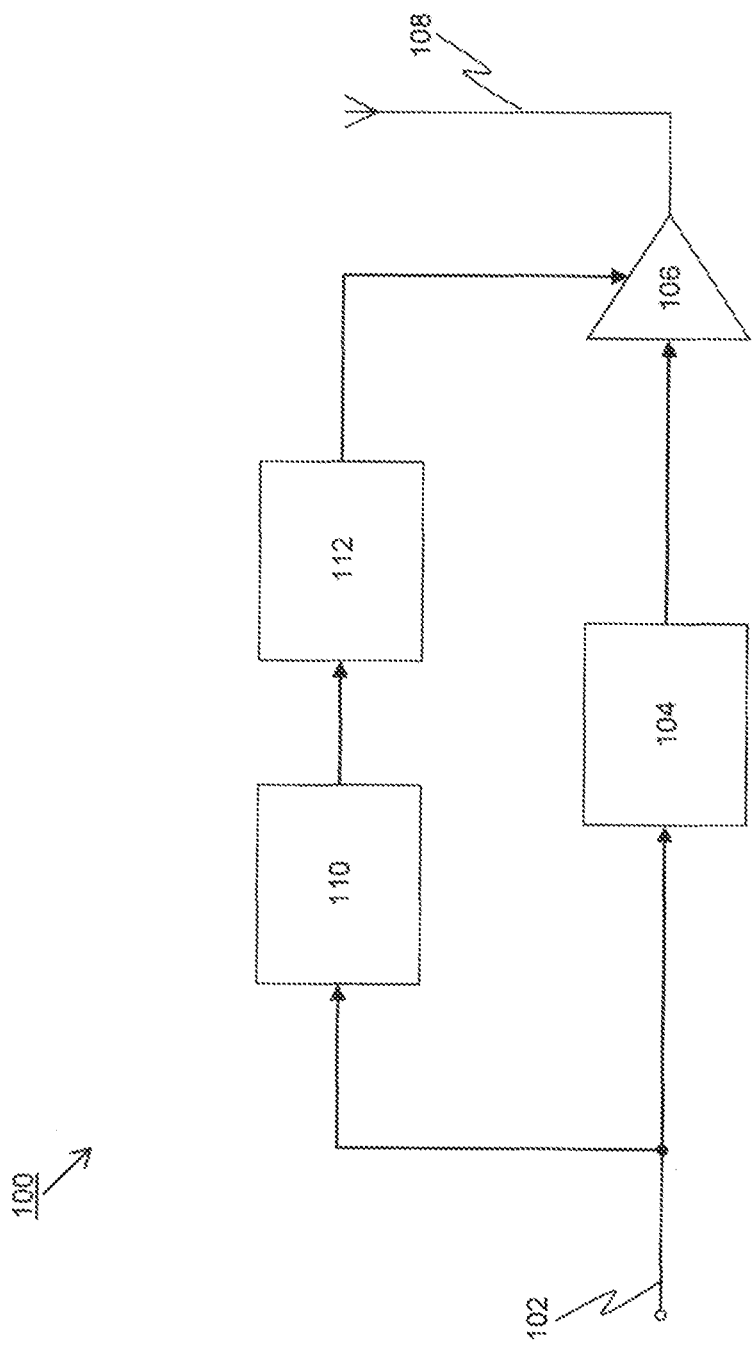
FIG. 1 shows schematically a known envelope tracking transmitter arrangement.
Figure 2:
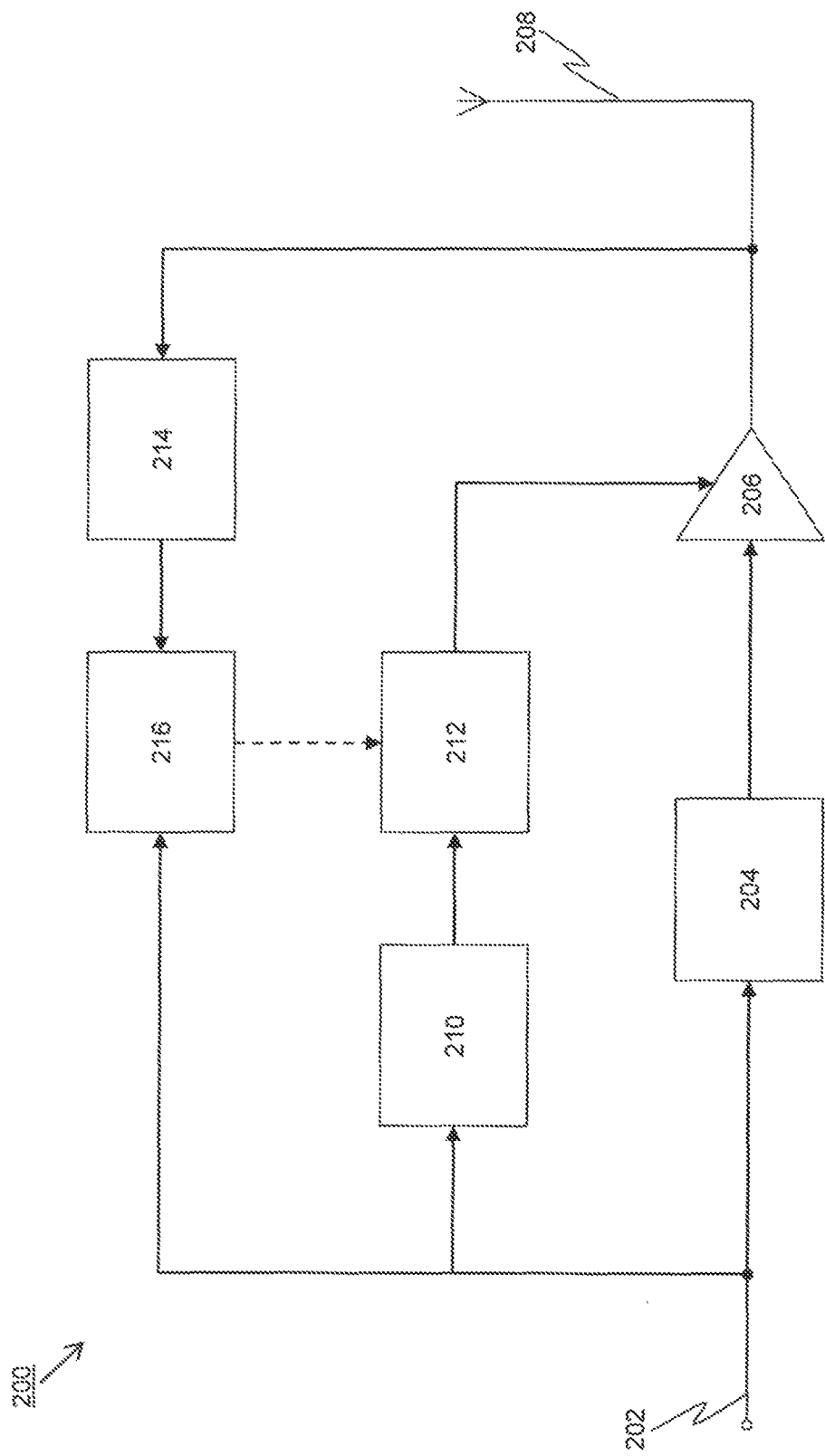
FIG. 2 shows schematically a transmitter arrangement in which embodiments of the invention may be practiced.

FIG. 2 shows schematically a transmitter arrangement 200 in which embodiments of the invention may be practiced. Data signal 202 is supplied to modulation circuit 204 which performs the necessary operations to modulate the data signal onto a higher frequency carrier signal. Data signal 202 may comprise a single signal, or multiple signals, for example as used in a quadrature encoded modulation scheme. Modulation circuit 204 may comprise one or more filters, local oscillators, quadrature generators, frequency mixers, amplifiers etc. The form and function of suitable modulation circuits, such as the direct conversion modulator, is well known in the art, and will not be discussed here. The modulated output signal of modulation circuit 204 is then supplied to power amplifier 206 in order to amplify the strength of the signal prior to transmission via antenna 208. Power amplifier 206 is in operative association with a variable supply voltage, which may be varied during operation of the transmitter to change the operating range of the power amplifier. In the present embodiment the transmitter arrangement 200 comprises an envelope tracking transmitter. The transmitter arrangement 200 may comprise one or more further components such as filters, amplifiers, tuning loads etc (not shown).

In order to improve the efficiency of the transmitter 200, an envelope detector 210 is used to determine the magnitude of data signal 202. The determined magnitude is then referenced against a predetermined mapping between the magnitude of the signal and an efficient supply voltage for power amplifier 206. The supply voltage of power amplifier 206 is dynamically altered during operation, on the basis of the mapping and the determined magnitude, to improve the operating efficiency of transmitter 100. According to the embodiments depicted in FIG. 2, the predetermined mapping is stored in a data store, accessible to transmitter 200, in the form of shaping table 212. The data store may comprise a read only memory, or other such non-transient memory available to a suitable processing system such as a digital signal processor (DSP).

In order to provide calibration of the envelope tracking transmitter, the phase distortion of the envelope tracking transmitter is determined. According to the embodiments shown in FIG. 2, measurement receiver 214 is positioned subsequent to power amplifier 206, but prior to antenna 208 in order to facilitate calculation of the phase distortion of the power amplifier. In some embodiments, the signal to be transmitted may be divided between the measurement receiver and antenna 208, for example using resistive, capacitive or inductive division. In alternative embodiments, a coupler (not shown) may be used to provide the necessary signal to measurement receiver 214.

In operation, calibration unit 216 determines the phase distortion of power amplifier 206. In some embodiments, calibration unit 216 determines the phase distortion of power amplifier 206 by comparing a signal measured subsequent to the output of power amplifier 206 with a signal supplied prior to power amplifier 206. In the embodiments shown in FIG. 2, the signal measured subsequent to the output of power amplifier 206 is supplied to calibration unit 216 as the output of measurement receiver 214 and the signal supplied prior to power amplifier 206 is reference data signal 202. In alternative embodiments, the signal supplied prior to power amplifier 206 is the modulated output signal of modulation circuit 204, or an intermediate signal generated by modulation circuit 204. Such a signal may be supplied to calibration unit 216 using a further measurement receiver (not shown) positioned prior to the input of power amplifier 206. On the basis of the determined phase distortion of power amplifier 206, calibration unit 216 calibrates the envelope tracking transmitter 200. By calibrating envelope tracking transmitter 200 on the basis of the phase distortion of power amplifier 206, more accurate and/or reliable measurements can be made, allowing the transmitter to be calibrated more accurately. In particular, calibration of envelope tracking transmitter 100 is achieved without requiring inaccurate gain measurements, thereby improving the operating efficiency of envelope tracking transmitter 100. Although described in this embodiment as a single unit, the calibration unit may comprise one or more physical or logical devices, and the functions of the calibration unit may be divided among more than one physical or logical device. For example, the phase distortion of the power amplifier may be determined by a phase comparison unit, comprising one or more physical or logical devices, the output of which is acted upon by the calibration unit to calibrate the transmitter. In some embodiments, the phase comparison unit and the calibration unit comprise separate physical or logical devices. In alternative embodiments, the calibration unit comprises the phase comparison unit.

According to embodiments, calibration unit 216 can also identify the instantaneous power of the signal and compare the determined phase distortion of the power amplifier to a predefined phase distortion for the given instantaneous power. Calibration unit 216 may identify the instantaneous power of the signal using a result from an envelope detector, such as envelope detector 210. In arrangements wherein data signal 202 comprises in-phase and quadrature encoded data, calibration unit 216 may identify the instantaneous power of the signal by calculating the square of the in-phase component, the square of the quadrature component, and adding these squared components. On the basis of this comparison, calibration unit 216 may then calculate a phase offset between the determined phase distortion and the predefined phase distortion. This calculated phase offset is then used to calibrate the envelope tracking transmitter. As described above, the calibration unit or functions of the calibration unit may be divided into more than one physical or logical device. In some embodiments, the phase offset may be determined by an offset determination unit, comprising one or more physical or logical devices, the output of which is acted upon by the calibration unit to calibrate the transmitter. In some arrangements, the offset determination unit operates on the output of the phase comparison unit to determine the phase offset. In some embodiments, the offset determination unit and the calibration unit comprise separate physical or logical devices. In alternative embodiments, the offset determination unit may be comprised within one or more of the phase determination unit and the calibration unit.

The predefined phase distortion may comprise a preferred phase distortion for the given instantaneous power that corresponds to a suitably efficient operation of power amplifier 206. The predefined phase distortion may be determined empirically or theoretically, and stored in a data store accessible by envelope tracking transmitter 200. The predefined phase distortion may be determined prior to, during, or soon after production of envelope tracking transmitter 200, but prior to its normal use. This allows the predefined phase distortion to be determined in isolated conditions, using more advanced algorithms and/or test sequences than might otherwise be available. The predefined phase distortion may be determined individually for a given envelope tracking transmitter and/or power amplifier. Alternatively, a predefined phase distortion may be determined for a given production run, model or class of transmitters and/or power amplifiers.

Calibration of the envelope tracking transmitter may comprise modifying the mapping between the magnitude of the data signal 202 and the supply voltage of power amplifier 206. According to the embodiments shown in FIG. 2, this mapping is stored in shaping table 212. In such embodiments, calibration unit 216 calibrates the envelope tracking transmitter by modifying the contents of shaping table 212 according to the determined phase distortion of power amplifier 206. If the determined phase distortion of power amplifier 206 substantially matches the predefined phase distortion for the given instantaneous power (i.e. is the same, or is within a predetermined threshold of similarity), then the mapping is unchanged. However, if the determined phase distortion of power amplifier 206 differs from the predefined phase distortion for the given instantaneous power, the mapping is modified to compensate for this difference. This modification provides a feedback loop for ongoing recalibration of envelope tracking transmitter 200 during normal operation.

In some embodiments, modification of the mapping between the magnitude of the data signal 202 and the supply voltage of power amplifier 206 is proportional to the size of the phase offset calculated between the determined phase distortion and the predefined phase distortion. For example, the power amplifier supply voltage in the mapping for the given instantaneous power may be adjusted by a certain number of millivolts per degree of the determined phase offset. This adjustment may then be repeated over time until the determined phase offset is reduced close to zero, and the determined phase distortion substantially matches the predefined phase distortion for the given instantaneous power.

In order for calibration unit 216 to accurately compare the phase of the signal measured by measurement receiver 214 to the reference data signal 202, a time alignment operation may be required between the two signals to ensure that corresponding portions of the signals are compared. This may comprise applying a delay operation to one or more of the signal measured by measurement receiver 214 and the reference data signal 202, for example through the use of one or more buffers or delay units (not shown). Alternatively, the time alignment operation may comprise the use of correlating logic to match corresponding portions of the two signals.

In some embodiments, the processing carried out by calibration unit 216 is performed in the digital domain. In such arrangements, data signal 202 may comprise a digital signal. Further, measurement receiver 214 may also comprise an analogue to digital converter adapted to convert the measured signal into a digital representation thereof for further processing in the digital domain. Hence, one or more of the signal measured by measurement receiver 214 and the reference data signal 202 are sampled prior to processing by calibration unit 216. Corresponding samples of the signal measured by measurement receiver 214 and the reference data signal 202 may then be time aligned as described previously to enable an accurate phase comparison by calibration unit 216. In embodiments, wherein the functions of calibration unit 216 are performed by more than one physical or logical device, such as the aforementioned phase comparison unit and/or offset determination unit, the processing carried out by one or more of these further physical or logical devices may also take place in the digital domain.

In order to make an accurate determination of the phase distortion of the power amplifier, the determined phase distortion may comprise an average determined phase distortion over a measurement time period. Several samples of both the signal measured by measurement receiver 214 and the reference data signal 202 may be taken during the measurement time period, and a phase distortion of power amplifier 206 can be determined for each pair of samples. Throughout the measurement time period, the phase distortions calculated for multiple pairs of samples having the same given instantaneous power are grouped. By summing all of the calculated phase distortions in a given group and dividing by the number of phase distortions in the group, an average determined phase distortion over the measurement time period can be determined for the given instantaneous power. On the basis of this determined average phase distortion at the given instantaneous power, a phase offset for the given instantaneous power can be calculated, and the envelope tracking transmitter 200 can be calibrated to compensate, i.e. by modifying the mapping for the given instantaneous power.

During a measurement time period it is unlikely that all of the samples taken will correspond to the same given instantaneous power. Average phase distortions at further instantaneous powers can be calculated in an analogous manner to that described above by grouping those samples into one or more further groups. The contents of these further groups can then be averaged to determine further average phase distortions, corresponding to the further instantaneous powers, over the same measurement time period. In turn, these further phase distortions can be compared to predefined phase distortions for the corresponding instantaneous powers to calculate further phase offsets. The envelope tracking transmitter 200 can then be further calibrated on the basis of these further phase offsets, i.e. by modifying the mappings for the further instantaneous powers on the basis of the corresponding calculated phase offsets.

According to some arrangements, the samples may be grouped according to ranges of instantaneous powers. The size of each of the ranges may be selected according to an expected number of samples in each group during a measurement time period, i.e. such that enough samples are obtained for a sufficient averaging operation, but such that the ranges are narrow enough to allow for meaningful granularity of calibration. In arrangements in which samples are grouped by ranges of instantaneous powers, the calibration of the envelope tracking transmitter on the basis of a phase offset determined for a given range may comprise modifying one or more mappings corresponding to instantaneous powers that fall within the given range. In some embodiments, the samples are grouped according to ranges of instantaneous powers that correspond to piecewise-linear segments in shaping table 212. For example, one group of samples may calibrate a single support point in a piecewise-linear approximation in shaping table 212.

An alternative algorithm for determining the phase distortion of each pair of samples involves multiplying the sample from the signal measured by measurement receiver 214 by the complex conjugate of the corresponding sample from the data signal 202, resulting in a complex-valued product. The average determined phase angle for a given group of samples is then determined by calculating the phase angle of the complex sum of the complex-valued products in the group.

In some embodiments, the processing methods described above are performed by a digital signal processor. According to some arrangements, the samples of the signal measured by measurement receiver 214 and the data signal 202 are stored for subsequent processing, thereby alleviating the need to process the samples in real time.

It will be understood that the processor or processing system or circuitry referred to herein may in practice be provided by a single chip or integrated circuit or plural chips or integrated circuits, optionally provided as a chipset, an application-specific integrated circuit (ASIC), field-programmable gate array (FPGA), digital signal processor (DSP), etc. The chip or chips may comprise circuitry (as well as possibly firmware) for embodying at least one or more of a data processor or processors, a digital signal processor or processors, baseband circuitry and radio frequency circuitry, which are configurable so as to operate in accordance with the exemplary embodiments. In this regard, the exemplary embodiments may be implemented at least in part by computer software stored in (non-transitory) memory and executable by the processor, or by hardware, or by a combination of tangibly stored software and hardware (and tangibly stored firmware).

Although at least some aspects of the embodiments described herein with reference to the drawings comprise processes performed in processing systems or processors, the invention also extends to computer programs, particularly computer programs on or in a carrier, adapted for putting the invention into practice. The program may be in the form of non-transitory source code, object code, a code intermediate source and object code such as in partially compiled form, or in any other non-transitory form suitable for use in the implementation of processes according to the invention. The carrier may be any entity or device capable of carrying the program. For example, the carrier may comprise a storage medium, such as a solid-state drive (SSD) or other semiconductor-based RAM; a ROM, for example a CD ROM or a semiconductor ROM; a magnetic recording medium, for example a floppy disk or hard disk; optical memory devices in general; etc.

Figure 3:
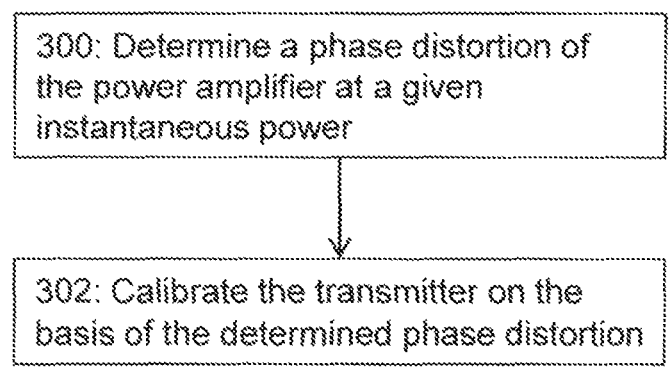
FIG. 3 shows a flow diagram describing the operation of embodiments of the invention.

FIG. 3 is a flow diagram that describes the operation of embodiments of the invention, and in this regard, FIG. 3 represents steps performed by one or a combination of the aforementioned control circuitry, digital signal processor, processing system or processors, baseband circuitry and radio frequency circuitry for calibrating an envelope tracking transmitter comprising a power amplifier in operative association with a variable supply voltage.

At step 300, a phase distortion of the power amplifier at a given instantaneous power is determined. At step 302, the transmitter is calibrated on the basis of the determined phase distortion.

The above embodiments are to be understood as illustrative examples of the invention. Further embodiments of the invention are envisaged. For example, while the above embodiments have been discussed in relation to envelope tracking transmitters, the apparatus, methods and computer software disclosed herein are similarly applicable to any transmitter arrangement where the supply voltage of an amplification stage is varied in a deterministic manner, such as a polar transmitter or an envelope-elimination-and-restoration transmitter, for example. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

We claim:

1. A method for calibrating a transmitter comprising a power amplifier in operative association with a variable supply voltage, the method comprising:
   determining a phase distortion of the power amplifier at a given instantaneous power by comparing a measurement of a signal supplied prior to the power amplifier to a measurement of a signal output from the power amplifier; and
   calibrating the transmitter on a basis of the determined phase distortion, wherein
   the determining comprises determining phase difference between time aligned samples of the signal supplied prior to the power amplifier and samples of the signal output from the power amplifier by at least:
   grouping the samples according to instantaneous power of each sample, the grouping of the samples including at least a group corresponding to the given instantaneous power, and
   calculating an average value of the determined phase difference such that the determined phase distortion is determined on a basis of the samples in said group.

2. The method according to claim 1, comprising:
   calculating a phase offset between the determined phase distortion, and a predefined phase distortion for the given instantaneous power; and
   using the calculated phase offset to calibrate the transmitter.

3. The method according to claim 2, comprising accessing data associated with an offline calibration process for the transmitter, whereby to identify said predefined phase distortion.

4. The method according to claim 3, wherein the offline calibration process is performed during production of the transmitter.

5. The method according to claim 1, wherein the determination of the phase distortion of the power amplifier at the given instantaneous power is performed using a measurement receiver.

6. The method according to claim 1, wherein the signal supplied prior to the power amplifier and the signal output from the power amplifier are time aligned prior to said comparison.

7. The method according to claim 1, wherein the signal supplied prior to the power amplifier and the signal output from the output of the power amplifier are sampled at regular intervals prior to said comparison.

8. The method according to claim 1, wherein the determined phase distortion of the power amplifier at the given instantaneous power comprises an average phase distortion over a measurement time period.

9. The method according to claim 1, wherein the determined phase distortion is for an individual gain stage of the transmitter at the given instantaneous power, said individual gain stage comprising the power amplifier.

10. An apparatus for calibrating a transmitter comprising a power amplifier in operative association with a variable supply voltage, the apparatus comprising:

at least one phase comparison unit configured to determine a phase distortion of the power amplifier at a given instantaneous power by comparing a measurement of a signal supplied prior to the power amplifier to a measurement of a signal output from the power amplifier; and at least one calibration unit configured to calibrate the transmitter on a basis of the determined phase distortion, wherein the at least one phase comparison unit determines the phase distortion by determining phase difference between time aligned samples of the signal supplied prior to the power amplifier and samples of the signal output from the power amplifier by at least:

grouping the samples according to instantaneous power of each sample, the grouping of the samples including at least a group corresponding to the given instantaneous power, and calculating an average value of the determined phase difference such that the determined phase distortion is determined on a basis of the samples in said group.

11. The apparatus according to claim 10, comprising a shaping table, the shaping table comprising a mapping between signal magnitudes and corresponding power amplifier supply voltages for the given instantaneous power, wherein the at least one calibration unit is configured to modify contents of the shaping table on a basis of the determined phase distortion.

12. The apparatus according to claim 10, comprising an envelope detector configured to identify a magnitude of the signal to be transmitted by the transmitter, wherein the supply voltage of the power amplifier is modified on a basis of the identified signal magnitude.

13. The apparatus according to claim 10, comprising a measurement receiver, the measurement receiver being configured to measure a signal subsequent to the output of the power amplifier, wherein the at least one phase comparison unit is configured to operate on the output of the measurement receiver.

14. The apparatus according to claim 10, further comprises:

a data store for storing a predefined phase distortion for the given instantaneous power; and at least one offset determination unit configured to compare the determined phase distortion of the power amplifier at the given instantaneous power with the predefined phase distortion for the given instantaneous power, whereby to determine a phase offset for the given instantaneous power, wherein the at least one calibration unit is configured to calibrate the transmitter on the basis of the determined phase offset.

15. The apparatus according to claim 10, wherein the apparatus comprises one or more of:
a chipset,
a front end module,
a transmitter,
a transceiver, and
a user equipment.

16. The apparatus according to claim 10, wherein the transmitter comprises an envelope tracking transmitter.

17. The apparatus according to claim 10, wherein the transmitter comprises one of:
an envelope elimination and restoration transmitter, and
a polar transmitter.

18. The apparatus according to claim 10, wherein the determined phase distortion is for an individual gain stage of the transmitter at the given instantaneous power, said individual gain stage comprising the power amplifier.

19. A non-transitory computer readable memory storing computer software for use in calibrating a transmitter in operative association with a variable supply voltage, the transmitter comprising a power amplifier, wherein when executed by at least one processor, the computer software is configured to perform a method, the method comprising:

determining the phase distortion of the power amplifier at a given instantaneous power by comparing a measurement of a signal supplied prior to the power amplifier to a measurement of a signal output from the power amplifier; and calibrating the transmitter on a basis of the determined phase distortion, wherein the determining comprises determining phase difference between time aligned samples of the signal supplied prior to the power amplifier and samples of the signal output from the power amplifier by at least:

grouping the samples according to instantaneous power of each sample, the grouping of the samples including at least a group corresponding to the given instantaneous power, and calculating an average value of the difference phase difference such that the determined phase distortion is determined on a basis of the samples in said group.

20. The non-transitory computer readable memory storing the computer software according to claim 19, wherein the determined phase distortion is for an individual gain stage of the transmitter at the given instantaneous power, said individual gain stage comprising the power amplifier.

* * * * *